(12) United States Patent
Stribley et al.

(10) Patent No.: US 8,513,764 B2
(45) Date of Patent: Aug. 20, 2013

(54) SCHOTTKY DIODE

(75) Inventors: Paul R. Stribley, Plymouth (GB); Suba Chithambaram Subramaniam, Plymouth (GB)

(73) Assignee: X-Fab Semiconductor Foundries AG (DE)

( * ) Notice: Subject to any disclaimer, the term of this patent is extended or adjusted under 35 U.S.C. 154(b) by 222 days.

(21) Appl. No.: 13/030,859

(22) Filed: Feb. 18, 2011

(65) Prior Publication Data

US 2012/0211859 A1  Aug. 23, 2012

(51) Int. Cl.
*H01L 29/872* (2006.01)
*H01L 21/329* (2006.01)

(52) U.S. Cl.
USPC ............ 257/484; 257/E29.338; 257/E21.359; 438/570

(58) Field of Classification Search
USPC .................. 257/471, 484, E29.338, E21.359; 438/570
See application file for complete search history.

(56) References Cited

U.S. PATENT DOCUMENTS 5,696,025 A * 12/1997 Violette et al. ................ 438/570
2001/0048135 A1 * 12/2001 Leipold .......................... 257/369

FOREIGN PATENT DOCUMENTS

GB  2451122 A * 1/2009
GB  2451124 A * 1/2009

* cited by examiner

*Primary Examiner* — Victor A Mandala
*Assistant Examiner* — Whitney T Moore
(74) *Attorney, Agent, or Firm* — Thompson Hine L.L.P.

(57) ABSTRACT

A Schottky diode including a semiconductor region, a first terminal comprising a metal or a metal silicide or being metallic, and a second terminal comprising at least a portion of the semiconductor region. The diode further includes an at least partly conductive material or a material capable of holding a charge in close proximity to, or in contact with, or surrounding one of the first and second terminals, a field insulator located at least partly in the semiconductor region, a dielectric region located over the semiconductor region between the field insulator and the one of the first and second terminals for isolating the conductive or charge-holding material from the semiconductor region, and wherein the dielectric region comprises insulating regions of different thicknesses.

32 Claims, 2 Drawing Sheets

SCHOTTKY DIODE

FIELD

The present invention relates to a Schottky diode. Certain embodiments provide a Schottky diode which has reduced leakage current and forward voltage drop, and improved breakdown capability.

BACKGROUND

A Schottky diode is a semiconductor diode made by a contact of a metal with a semiconductor. Due to the difference in electron energy levels at the metal and semiconductor surface, conduction occurs over an energy barrier. This conduction is voltage and polarity dependent, which gives rise to the current-voltage curve of the diode. Good conduction occurs in the forward polarity as the current rises exponentially with voltage. However, conduction is restricted in the reverse polarity, where only a "leakage" current flows. The "leakage" current is weakly dependent on voltage. Breakdown of the diode occurs at a high reverse voltage, caused by carriers being accelerated in a very high electric field which reaches a sufficient energy level to create an avalanche of electron-hole pairs in the semiconductor.

Schottky diodes can be compared with semiconductor p-n junction diodes (metallurgical junctions between n-type and p-type semiconductor). In the latter devices, conduction is dominated by minority carriers through the metallurgical junction region. By way of contrast, in Schottky diodes the conduction is dominated by majority carriers and occurs mostly by thermionic emission with some carrier diffusion.

The forward voltage drop (which is the voltage required to conduct reasonably well in the forward conduction polarity) tends to be lower for Schottky diodes compared to semiconductor junction diodes. For silicon p-n junction diodes, the forward voltage drop is typically about 700 mV but for Schottky diodes, comprising e.g. titanium silicide on silicon, the forward voltage can be less than about 100 mV.

Being majority carrier devices, Schottky diodes are inherently faster to respond to electrical signals than junction diodes. The time constant for Schottky diodes is smaller than for junction diodes, which also have an associated diffusion capacitance in forward bias. This is not the case in Schottky diodes. There is virtually no delay for the diode to switch from conducting to non-conducting state because there is no p-type to n-type zone which needs to be formed—as is the case for PN junction diodes. Capacitances for these diodes can also be very low, especially if the semiconductor material is very lowly doped. In reverse bias the diode capacitance is inversely proportional to the semiconductor depletion depth (the region in which the carriers are depleted), which is thicker for low doping levels at a given voltage. The superior operational speed of Schottky diodes makes them very useful in circuits and since they can be integrated into modern semiconductor ICs, they can be a more cost effective solution than alternative components.

Schottky diodes are often used in circuits for high speed rectification of RF signals because of their performance as a fast diode (due to a small time constant, conduction by majority carriers and low capacitance). This application area gave rise to the development of the first point contact rectifiers, known as "cat's whiskers" used in pioneering radio equipment at the start of the twentieth century.

Furthermore, Schottky diodes have a wide range of applications as a general electronic component. For example, they can be used in charge pumps to generate larger in-circuit voltages using a lower source voltage supply. Another common circuit application is the use in diode voltage clamps for preventing over-voltage spikes, e.g. on a power supply line.

Schottky diodes can be made of metallic contacts to any semiconductor material. They can be made of a variety of metals or refractory silicides in direct contact with doped silicon. Hence they are compatible with mainstream planar silicon semiconductor processes which are used for integrated circuit manufacture. They can be combined with many other components on a single silicon chip. However, the integration of the best possible Schottky diode within a semiconductor fabrication process is an engineering challenge.

A Schottky diode is usually made of an n-type semiconductor in contact with a metal. In this configuration, the n-type semiconductor is the cathode and the metal is the anode. This structure is suitable for integration in chips because the wafer substrate on mainstream semiconductor processes is normally a p-type single crystal silicon substrate. Thus the cathode is junction isolated from the wafer substrate and the anode and cathode are available for connection into circuits. It is also possible to form Schottky diodes using p-type semiconductor connected with a metal but this type is rarely used.

Problems are often associated with the manufacture of Schottky diodes. One of these arises from the need for the semiconductor material to be very lightly doped. This is desired to ensure that the junction gives a good current-voltage response and also to keep the reverse bias parasitic capacitance low. However the lightly doped semiconductor has a relatively large series resistance. Hence the maximum current flow can be restricted by the series resistance. Further, self-heating can occur because of the semiconductor resistance, which may cause some thermal instability.

In order to keep the series resistance of the diode low, an appropriate doping and layout style should be chosen. In practice this means that the diode is arranged in alternate stripes of anode and cathode connections. Such an arrangement keeps the resistive effects small because the resistance varies inversely with the width and is proportional to the length (i.e. the pitch between stripes in this case). The cathode regions may have extra doping to reduce ohmic connection resistances. Connections to the cathode are made by heavily doping the semiconductor to a degenerate level and then making a metal connection to the degenerately doped semiconductor. In this case it forms an ohmic (resistive) connection rather than a Schottky (diode) connection. This is because the heavily doped semiconductor behaves like a metal. Metal to metal connections are ohmic in their electrical behaviour, and the number of contacts to the anode and cathode are maximized to reduce the series resistance of these connections. Electrical connecting wires to the rest of the circuit are attached to these metal contacts.

Further improvements within the semiconductor can be achieved by engineering a connection to the cathode which is diffused underneath the lowly doped semiconductor. This may not be absolutely necessary but could be used to minimize parasitic series resistance. A doped n-type region can be diffused vertically to connect the cathode metal and degenerately doped, n+ regions to the buried n-type layer. This can further reduce parasitic series resistance, at the expense of process complexity.

Another problem associated with Schottky diodes is breakdown voltage. This is dependent on the semiconductor doping (lower doping gives a higher breakdown voltage). With a high reverse bias the diode will start to conduct abruptly at the breakdown voltage. This is generally many volts (e.g. 30V), but tends to be somewhat lower for Schottky diodes than for PN junction diodes using a similar semiconductor doping. The edge of the diode is the weakest area in terms of breakdown. The vertical edge sharpness enhances the electric field and so breakdown may be most likely to occur at the edge. Further, the edges are less ideal in their material structure than central regions since they comprise more surface states and traps. This can reduce the breakdown voltage and early breakdown may occur. Before a sharper breakdown, a "soft" breakdown may also occur when the edge related leakage current escalates rapidly at moderate voltages.

However one of the major problems with Schottky diodes is the relatively high reverse bias leakage compared to PN junction diodes. Diode leakage is caused by the generation of extra carriers within the diode metal to semiconductor interface at reverse bias. The quality of the metal to semiconductor interface is critical in determining the reverse leakage. Leakages can be very high, in particular at the edges of a Schottky diode because the edge is usually the most defective region. Further, reverse breakdown voltages tend to be lower at the edges of the Schottky diode due to electric field enhancement at the sharp edge.

One technique of addressing the leakage issues with Schottky diodes involves insetting the metal interface into the semiconductor active area and to add a doped diffused semiconductor ring around the edge of the diode. An example of this technique is illustrated in FIG. 1. The components of the Schottky diode shown in FIG. 1 are as follows:

1. Metallization connection wiring layer; e.g. aluminum copper alloy >300 nm thickness
3. Field isolation dielectric layer; e.g. LOCOS or STI silicon dioxide >200 nm thick
4. P-type semiconductor diffusion; lightly doped; under LOCOS or STI
6. Lightly doped N-type semiconductor cathode; deep n-well
8. Metal Silicide layer, e.g. titanium silicide, used to connect to the semiconductor; used as the schottky diode anode metal node and also formed on top of the guard ring (18) and cathode connection.
9. Metal connection contact plug, e.g. tungsten plug
10. Dielectric layer; isolates wiring layer from the device
11. Highly doped N-type semiconductor for ohmic connection to cathode of diode
14. Lightly doped P-type semiconductor substrate, e.g. silicon single crystal wafer
18. Moderately doped P-type semiconductor diffusion ring termination (guard ring) at the edge of the anode silicide layer For metal connections to n-type silicon (such as n-type diffusion 6) the additional ring 18 is p-type. This p-type ring 18 forms a PN junction diode at the edge of the component and prevents the very high Schottky diode leakage which would otherwise be seen at the edge.

SUMMARY

The present inventors have appreciated a drawback associated with the above system: the p-type ring 18 forms a PNP bipolar transistor with the n-type semiconductor diffusion 6 and the p-type silicon substrate material 14. Hence there is a parasitic bipolar leakage from the anode to the p-type substrate 14, the substrate being the universal ground of any IC circuitry. This leakage term can be significant and because it is to the ground, it can be very detrimental to some types of circuits—e.g. charge pumps.

Capacitances for the Schottky diode are mainly due to the reverse bias capacitance of the semiconductor. This can be reduced by using lightly doped semiconductor. However, if a diffused guard ring 18 is used there is additional parasitic junction diode capacitance from the ring 18 to the semiconductor node 6. This is a capacitance in parallel with the Schottky diode. Additionally metal overlapping of the edges of a Schottky connection (in the case of FIG. 1, the overlap between the anode connection 8 and the diffused ring 18) will give rise to parasitic capacitance between the diode nodes.

The present invention aims to address the aforementioned drawbacks.

According to one aspect of the invention there is provided a Schottky diode comprising:
  a semiconductor region,
  a first terminal comprising a metal or a metal silicide or being metallic,
  a second terminal comprising at least a portion of the semiconductor region,
  a material in close proximity to, or in contact with, or surrounding one of the first and second terminals, wherein said material is one of an at least partly conductive material and a material capable of holding a charge,
  a field insulator located at least partly in the semiconductor region,
  a dielectric region located over the semiconductor region between the field insulator and said one of the first and second terminals for isolating said material from the semiconductor region,
  wherein the dielectric region comprises insulating regions of different thicknesses.

Embodiments of this invention enable the aforementioned process integration of the Schottky diode and also the improvement of Schottky diode electrical parameters. The invention also enables the re-use of structures inherent in modern semiconductor processing, e.g. CMOS, for easy integration of the component with other devices. This is due to the optimisation of the semiconductor surface quality which, in the ideal case, causes no damage from unwanted surface implants and hence reduces the reverse bias leakage of the Schottky diode.

In embodiments of this invention, a diffused type guard ring is not required. Improvement of the layout of the Schottky diode allows the problem of parasitic leakage to substrate to be reduced or almost eliminated whilst maintaining a low reverse bias leakage and high reverse bias breakdown. The invention may reduce the parasitic capacitance of the diode structure compared with the diffused guard ring style. It may also improve the forward conduction current when the diode is built within a CMOS process.

According to another aspect of the invention there is provided a Schottky diode comprising:
  a first terminal comprising a metal or a metal silicide or being metallic,
  a second terminal comprising the semiconductor material,
  a material in close proximity to, or in contact with, or surrounding one of the first and second terminals, wherein the material is one of an at least partly conductive material and a material capable of holding a charge,
  a field insulator located in a well region located in or on a substrate made of the semiconductor material,
  a dielectric region located over the semiconductor region between the field insulator and one of the first and second terminals for isolating the material from the semiconductor region, the dielectric region having first and second portions,
  wherein an ion implanted threshold adjusting material is located in the semiconductor region underneath the first portion of the dielectric region but not underneath the second portion, and wherein the second portion is located between the one of the first and second terminals and the first portion of the dielectric region.

Further aspects and features of the invention are set out in the accompanying claims.

BRIEF DESCRIPTION OF THE DRAWINGS

Some embodiments of the invention will now be described by way of example only and with reference to the accompanying drawings, in which.

DETAILED DESCRIPTION

Figure 1:
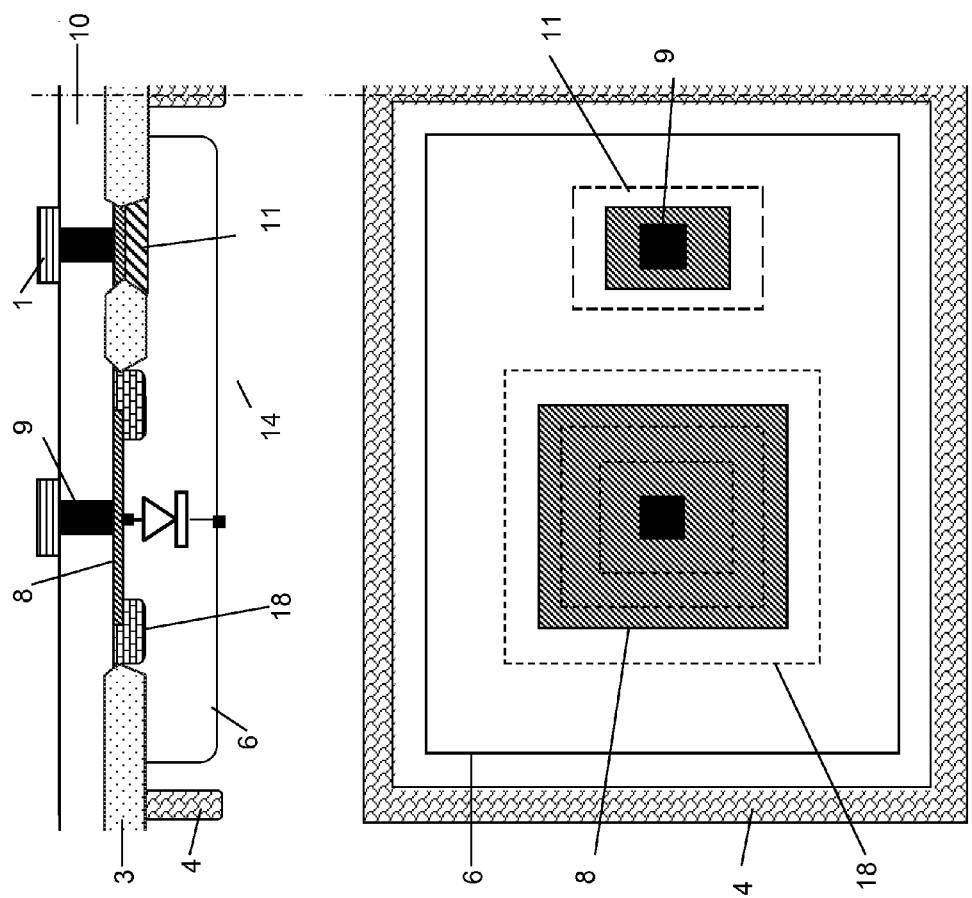
FIG. 1 is a sectional view, and a plan view of the layout of a Schottky diode.

An embodiment of the present invention will now be described with reference to FIG. 2. Like components shown in FIGS. 1 and 2 carry like reference signs. The components of the Schottky diode of FIG. 2, which are not present in the diode of FIG. 1, are as follows:

2. Polysilicon (metallic) guard ring at the edge of the anode connection
5. N-type sub-field diffusion implant, e.g. shallow n-well
7. Sidewall spacer dielectric at the edge of the guard ring, e.g. silicon dioxide
8a. Metal Silicide layer, e.g. titanium silicide, formed on top of the guard ring 2
8b. Metal Silicide layer, e.g. titanium silicide, formed underneath the cathode connection
12. Thick dielectric region, e.g. silicon dioxide <150 nm
13. Thin dielectric region, e.g. silicon dioxide <15 nm
15. Threshold adjustment implant under thin dielectric region, e.g. p-type implant
16. An edge where the thinner dielectric meets the thicker dielectric
17. Edge of active area of semiconductor where the device meets the field isolation dielectric region In the embodiment shown in FIG. 2, a lightly doped n-type well region (semiconductor region) 6 for the cathode of the Schottky diode is used. Hence the cathode is junction isolated from the p-type silicon body (substrate) 14 which supports all the IC components. Within the n-type well 6 is a region of surface (immediately below metal or metal silicide layer 8) used to make the device which is surrounded by a thick insulating dielectric 3 (e.g. a thick field silicon dioxide which may be created by a LOCOS "local oxidation of silicon" or STI "shallow trench isolation" process). A moderately doped n-type semiconductor diffusion 5 may also be provided within the well region 6, under cathode 11, to reduce forward resistance. Additional p-type diffusion implants 4 under the field region are used to electrically isolate adjacent components laterally on the semiconductor substrate 14. It will be appreciated that alternative isolation schemes are also possible, e.g. vertical dielectric filled trench isolation and silicon on insulator substrates, but these variants will not affect the performance of the Schottky diode proposed in this invention.

An at least partially conductive guard ring structure 2, for example a poly-crystalline silicon (polysilicon) guard ring, is provided. The guard ring 2 may comprise metal, metallic silicide, doped or undoped semiconductor or a combination of these materials. The guard ring 2 may be fully or partially conductive. The guard ring may alternatively be an insulator which is capable of holding a charge.

The guard ring 2 covers the edge of the active semiconductor area of the anode 8 (the silicon surface which forms the device) and overlaps over the field dielectric insulator zone 3. A thin dielectric region (layer) 12, 13 is formed under the ring 2 so that the ring is electrically isolated from the semiconductor active area. Within the "hole" in the ring there is a metal silicide region 8, e.g. titanium silicide, which forms the metallic anode part of the diode, and a thin dielectric spacer region 7 between the silicide anode 8 and the guard ring 2. Metal silicides are metallic compounds which are commonly used in modern semiconductor processes to minimise connection resistances on other components, e.g. transistors. The distance between the silicide anode 8 and the guard ring 2, when seen in projection towards the surface of the device, can for example be less than about 300 nm, 200 nm, 150 nm, 100 nm or 50 nm or could be as low as 0 nm. In FIG. 2, this distance is shown by the width of the spacer region 7.

The anode 8 can be electrically connected to the guard ring 2 using a metal wire 1, e.g. an aluminium wire connected to the contacts 9 of both the silicide area 8 and metallic ring (e.g. polysilicon) 2. In a variant of this embodiment, the guard ring 2 may be electrically connected to a separate wire, i.e. not connected to the anode 8, to allow it to be biased separately from the anode 8. Alternatively, it is possible to leave the guard ring 2 unconnected. It will be appreciated that this arrangement may not be advantageous due to the possibility of the ring charging up and therefore having an indeterminate potential.

With this configuration there is no need to use a p-type diffused junction region 18 as in the diode shown in FIG. 1. Hence the parasitic PNP bipolar component is substantially eliminated—thus reducing the leakage current between the anode and substrate to an insignificant amount.

The leakage is also suppressed compared to a simple region of active area which is simply bounded by the field oxide region 3. In the case shown in FIG. 1, the surface energy states at the edge of the active area cause a very large reverse bias leakage and also very low and electrically "soft" breakdown voltage. By way of contrast, pursuant to the present invention, the low number of surface states at the edge of the silicide 8 where it meets the flat, clean polysilicon 2 or spacer dielectric 7 means that the leakage is reduced. The polysilicon ring 2 also causes the surface potential to be modified at the edge of the silicide so that the leakage due to electric field intensity is reduced. This surface field reduction at the edge tends to give a larger reverse breakdown voltage, and a lower forward voltage drop.

In experiments the inventors have found that the guard ring does not otherwise interfere with the normal diode behaviour in forward or reverse bias.

Figure 2:
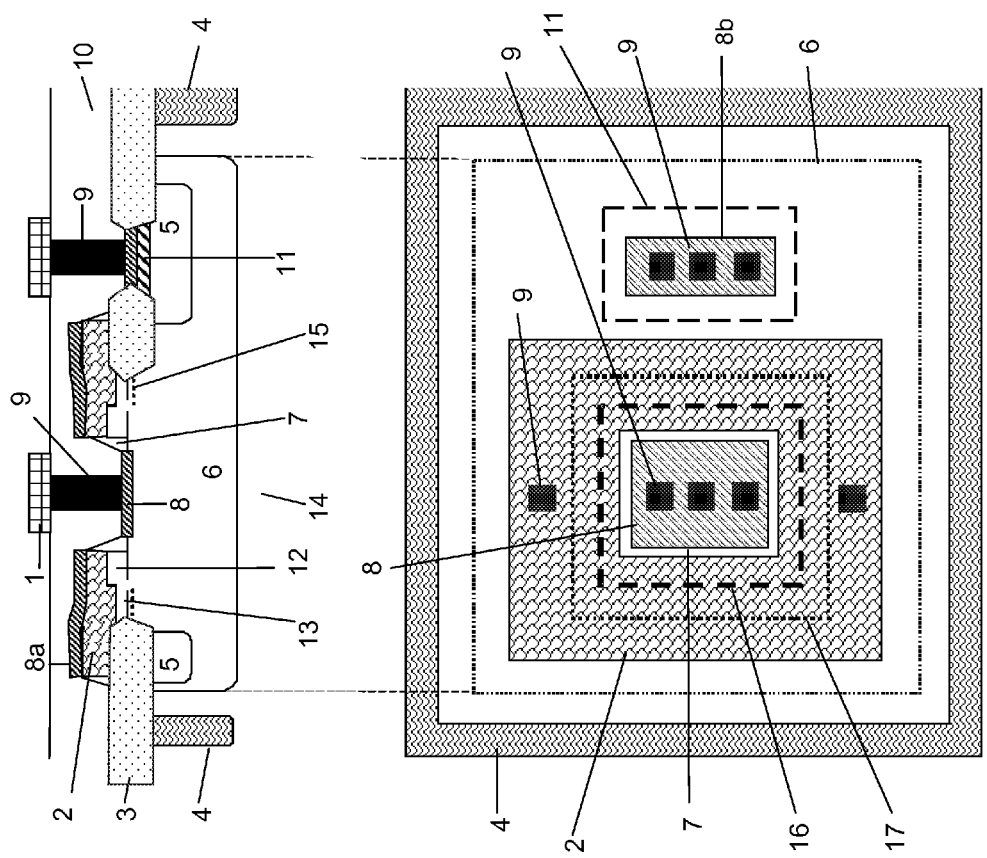
FIG. 2 is a sectional view and a plan view of the layout of a Schottky diode according to an embodiment of the present invention.

In FIG. 2, the Schottky diode comprises a metallic (e.g. doped polysilicon) guard ring 2 which is formed around the edges of a metal (e.g. titanium silicide) connection 8 to a semiconductor region 6 (e.g. n-doped silicon) to form the Schottky diode. The dielectric region 12, 13 is provided as a dual thickness dielectric region 12, 13 under the guard ring 2. The inner portion of the guard ring 2, closest to the anode 8, is isolated by a thicker dielectric 12 compared with the portion 13 (laterally) adjacent to it. The thinner dielectric 13 is situated between the inner thicker dielectric 12 and the outer portion of the guard ring where it passes over the field dielectric 3 (formed between adjacent structures).

The inventors have found that the optimum diode performance is achieved when the polysilicon guard ring 2 extends over the active area of the semiconductor region 6 to a much thicker dielectric region which is usually the field dielectric isolation 3 of the planar IC process (i.e. that formed between adjacent semiconductor active areas). In such an arrangement, the capacitance of the diode is lower. Further, connections to the polysilicon guard ring 2 are usually made to polysilicon placed on top of the field oxide in order to keep uniform contact resistance, so this is another reason why it is advantageous to form the guard ring 2 such that it extends over (part of) the field oxide 3.

However, it will be appreciated that in a variant of the above embodiment the guard ring 2 may not extend over the field dielectric 3. This arrangement may result in higher diode capacitance and the contact resistances may not be particularly uniform due to different depths of the vertical connections. When the connection resistances are not critical, it may be possible to make connections at different depths. Furthermore, in this variant there may be problems with very narrow, non-manufacturable regions of silicide outside the guard ring in an exposed active area. The size of the diode may get bigger if these outer parts were made wider for manufacturability (repeatability), which may "waste space" around the rings. However, in such an arrangement, the outer parts may be re-used for the cathode connections. When the capacitance of the diode is not a critical factor, this arrangement may be viable, and it would still have a low reverse leakage and good forward drive current. For an arrangement in which there is no gap between the guard ring 2 and the field dielectric 3, the inventors have further recognized that the ring may overlap the field dielectric a little in order to ensure repeatable manufacturability. This is to allow for any photolithography misalignment of the polysilicon to the active semiconductor region (active area). The overlap amount should be chosen so as to be sufficient to cope with the photolithographic misalignment tolerance at the very least.

In FIG. 2, the guard ring 2 modifies the surface potential and minimises leakage since the diode is formed where the semiconductor tends to be flattest and cleanest. The physical proximity of the thinner (thinnest) dielectric 13 of the ring needs to be close enough to the Schottky diode anode edge so that it has a beneficial electrical influence on the edge of the anode 8.

When a CMOS device is manufactured it is sometimes necessary to carry out an ion implantation process in order to create a threshold adjustment implant. The implant is a moderate dose of dopant ions which are put into the surface of semiconductor region 6. This implant is thermally activated and used to electrically tune the threshold voltage value for the CMOS components.

The present inventors have recognised that implanting the surface of the Schottky diode may have a detrimental effect. Firstly, there is implant related damage. To some extent the thermal activation heals the damage to the crystalline structure. However there is a possibility that some defects remain at the surface. Further, the dopant is usually the opposite type to the semiconductor region doping and thus severely impacts on the effective dopant concentration at the surface of the semiconductor region. When such a threshold adjustment implant is used near the metal (anode) connection 8 of the diode, the energy barrier height of the metal connection to the semiconductor is perturbed, which increases the forward voltage drop. Thus the diode is less conductive in the forward direction for a given voltage applied than if the implant was not used.

In one embodiment of the invention, a threshold adjustment implant 15 is used, but only under the thinnest oxide components 13. The implant 15 is therefore kept to the area under the middle or outermost part of the guard ring, i.e. away from the innermost part. Likewise the diode anode metal connection 8 will not have any threshold adjustment implant in the semiconductor surface in this embodiment. There is no need to have any threshold adjustment implant underneath the thicker oxide region 12 and the anode metal connection 8. By keeping the threshold adjustment implant away from the Schottky diode's anode 8, the energy barrier height of the metal connection to the semiconductor is improved, which reduces the forward voltage drop and increases the current drive. This arrangement of Schottky diode can deliver significantly more current in the forward direction. Further, this arrangement avoids surface damage and counterdoping near the anode region 8 to suppress reverse leakage which is critically dependent on the surface quality and electric field strength.

It will be appreciated that the threshold adjustment implant 15 can be implanted either before or after the oxidation process of the dielectric region. In one embodiment, the threshold adjustment implant is implanted before the (main) oxidation process in order to avoid implantation damage and to obtain the highest quality oxide. However, the present inventors have found that the implantation is best not done into a bare silicon surface and so a thin silicon dioxide layer is created on the wafer surface prior to the implantation step. This prevents several undesirable effects, e.g. it reduces unwanted contamination into the silicon surface.

Because the inner part of the guard ring has a thicker dielectric region 12 to insulate it from the semiconductor region 6, the capacitance of the guard ring is reduced. Thicker dielectrics have less capacitance per unit area than thin ones. Hence the parasitic capacitance of the diode design shown in FIG. 2 is less than an equivalent one which has a uniform, thin, dielectric thickness.

It is worth mentioning that when a design is used with a uniformly thicker dielectric then this may have lower capacitance still and this arrangement might be considered as a better component. However, in this case the guard ring structure may be less effective than the dual thickness dielectric case. Very thin dielectrics (e.g. silicon dioxide <15 nm) have greater influence on the electrical behaviour of the edges of the Schottky diode compared to thicker ones (e.g. silicon dioxide less than or equal to 150 nm). If a thicker dielectric was used throughout then the anode edge termination might not be sufficiently effective. In that case the reverse leakage and the breakdown voltage at the edge of the Schottky diode would be expected to be worse than the case with a thin dielectric.

Thus the threshold adjustment implant 15 under the guard ring below the outer dielectric portion 13 serves to further suppress the reverse bias leakage at the edges of the metal anode 8 due to the enhanced electrical effect of the different surface potential. The reverse bias leakage is dependent on the electrical potential, electrical field, number of impurities/defects and geometrical shape of the diode. The threshold adjustment implant 15 mainly changes the effective electrical potential of the surface of the semiconductor where it meets the dielectric regions 12, 13. This modifies the effective voltage of this zone when a reverse voltage is applied to the device, hence the net electrical field in reverse bias in the immediate vicinity of the guard ring at the edge of the Schottky diode can be changed. By modifying this electrical field the number of carriers (electron hole pairs) generated there can be reduced, which suppresses the leakage current. The leakage from the edge of the metal anode 8 is the largest contributor to the reverse bias leakage and thus any improvement there may provide maximum benefit for the Schottky diode component. Changing the electric field under the guard ring can also be used to shift the position of the peak field intensity with respect to the physical edge of the anode region

8. This edge may have the greatest number of defects and may therefore be the potential cause of the most part of the leakage current through carrier generation at these defects. Hence it may be desirable that the maximum electric field in reverse bias is not concentrated in this physical part of the device if at all possible. By introducing impurities under the guard ring 2, the nearby electric surface potential may be modified and thereby the electric field peak can be moved away from the critical component edge position. If a guard ring and surface adjustment implant were not used, the peak electric field position would normally be expected at the edge and coincide with the region where the greatest number of defects exist. This combination may not be desirable because this would maximize reverse leakage.

However, the threshold adjustment implant itself can be the source of defects and also perturbation to the surface workfunction of the semiconductor. Hence it may be undesirable to implant the precise region which is silicided for the Schottky diode design. For this reason the implanted part may be kept under the guard ring 2 in the present invention. As a result, it is in close proximity to the Schottky diode edge, for the advantage from the electrical field effect, but is kept out of the silicided zone itself so that it is less likely to cause any detrimental effects to the diode. The use of the thicker dielectric region 12 and spacer 7, creates a gap between the thin dielectric 13 (with implanted zone 15) and the silicide edge 8 to be controlled.

The inventors have found that the best structure is one which uses a dual thickness dielectric insulation of the polysilicon guard ring, with the thicker dielectric 12 inside, closest to the metal anode 8 and the thinner dielectric 13 positioned between the thicker portion and the field insulator 3 (which is a much thicker layer). The physical size of the polysilicon guard ring 2 may, in one case, be kept as small as possible, firstly to ensure that the parasitic capacitance is minimised, and secondly to ensure that the thin dielectric region 13 is close enough to the edge of the diode anode metal to provide the required electrical influence to suppress the edge leakage. In order to form a high density structure with minimal parasitic series resistance, it may be desirable to use ultra-small anode to cathode pitches, small guard ring size and very narrow wiring metallization. This is because the parasitic series resistance is proportional to the anode to cathode spacing and inversely proportional to the total width of the diode.

The diode having a single thickness dielectric (as shown in: GB2451124) has a greater parasitic capacitance compared to the multiple thickness dielectric case of the present invention. Further, the use of a single thickness dielectric makes it difficult to avoid surface implants since many CMOS processes rely on these implants into all thin dielectric areas. Such implants are detrimental to the Schottky diode forward bias voltage drop and current drive capability. In one embodiment of the present invention, locating the thinnest dielectric away from the anode 8 allows the threshold adjustment implants 15 to be kept away from the anode 8 of the Schottky diode.

Modern CMOS processes commonly use multiple dielectric layers (regions), e.g. dual thickness oxides. Thus the invention is compatible with planar IC CMOS and BiCMOS processes used for mainstream component manufacturing. It is therefore possible to use the invention to improve Schottky diode behaviour in these existing processes and also in future semiconductor processes.

It will be appreciated that variants of the isolation scheme which use several thicknesses of dielectrics (i.e. more than two) to isolate the guard ring are also possible. The principle is that the thinner portions 13 of the dielectric isolation should be within the area covered by the ring but not immediately adjacent to the Schottky diode's anode edge. The reason is that any threshold adjustment implant 15 which is normally used in that thinner region would have an adverse effect on the diode electrical properties if it was present either at the immediate anode edge or the interior (e.g. underneath the middle portion of the anode 8) of the Schottky diode. The thicker dielectric region 12 used under the ring 2 will reduce the parasitic capacitance compared to the case where a single thin dielectric is used. Thus it is advantageous to use dual or multiple dielectric thicknesses under the guard ring.

The manufacturing steps of an example of a Schottky diode such as shown in FIG. 2 are described below:

1. Start with a silicon mono-crystalline wafer
2. Thermal oxidation to grow a thin silicon dioxide (for giving a surface protection from contamination)
3. Photo-print well (semiconductor) regions, using organic photo-resist for example
4. Implant doping of well regions
5. Resist strip
6. Thermally diffuse well regions deeper into the silicon, and activate the dopant
7. Remove surface silicon dioxide
8. Thermal oxidation of a thin active area silicon dioxide buffer layer
9. Deposit a silicon nitride film, e.g. LPCVD
10. Photo-print active area regions
11. Etch active area regions
12. Resist strip
13. Field oxidation (the silicon nitride layer prevents oxidation of active areas; the oxide buffer layer prevents excessive stress as the oxidation lifts the nitride edges)
14. Remove remaining nitride and pad oxide
15. Thermal oxidation to grow an active area implant protection oxide
16. Implant various other structures, as required, e.g. thick dielectric region threshold adjust
17. Remove (e.g. hydrogen fluoride aqueous etching) all active area implant oxide, but leave the majority of the thicker field oxide 3
18. Grow thick dielectric region in active areas
19. Photo-print thin oxide mask
20. Implant threshold adjust 15 (thin dielectric region only)
21. Remove oxide from thin oxide areas
22. Resist strip
23. Grow thin dielectric region 13; this also slightly thickens the thick dielectric region zones 12
24. Deposit a layer of polysilicon 2, e.g. CVD
25. Implant the polysilicon with phosphorus (optional)
26. Anneal the wafers to activate the doping
27. Photo-print polysilicon mask
28. Etch polysilicon shapes, e.g. schottky guard ring 2
29. Resist strip
30. Photo-print n+ implant mask
31. Implant n-LDD sub-spacer diffusion
32. Resist strip
33. Photo-print p+ implant mask
34. Implant p-LDD sub-spacer diffusion
35. Resist strip
36. Deposit a spacer silicon dioxide layer 7, e.g. LPCVD
37. Etchback the oxide to form sidewall spacers 7 on the edges of polysilicon
38. Deposit an implant protection oxide, e.g. LPCVD
39. Photo-print n+ implant mask
40. Implant n+ diffusion
41. Resist strip
42. Photo-print p+ implant mask
43. Implant p+ diffusion 44. Resist strip
45. RTP thermal anneal to activate the implants electrically
46. Remove implant oxide from active areas and polysilicon; exposes silicon surfaces
47. Silicide metal 8 deposition (e.g. titanium)
48. Metal-silicide compound formation by thermal processing; e.g. titanium reacts with silicon and polysilicon surfaces
49. Etch off remaining un-reacted silicide metal and any bi-products (e.g. titanium nitride)
50. Thermally anneal the silicide to improve its chemical and physical structure
51. Deposit and anneal ILD dielectric layer, e.g. silicon dioxide LPCVD
52. Photo-print contacts
53. Etch contact holes in ILD
54. Resist strip
55. Deposit and form tungsten vertical connection plugs 9 in the contact holes
56. Deposit metal 1 wiring
57. Photo-print metal 1
58. Etch metal 1
59. Resist strip
60. Repeat to create further layers of metallization wiring
61. Deposit and anneal a passivation dielectric layer 10, e.g. silicon dioxide and silicon nitride
62. Photo-print electrical connection pad openings
63. Etch electrical connection pad openings in the passivation
64. Resist strip
65. Thermal hydrogen containing anneal and metal sinter
66. Wafers complete The present invention also extends to arrangements in which the dielectric region underneath the guard ring 2 has a uniform thickness but where the threshold adjustment implant is absent from underneath a portion of the dielectric region which is located towards the anode connection 8 (in other words, the present invention also covers arrangements such as in FIG. 2, but with a uniform thickness dielectric region 12, 13). Whilst not optimal, such an arrangement still has the advantage that it is usable with semiconductor processes which only have one dielectric region thickness available whilst improving the Schottky diode behaviour to some extent.

Conversely, the invention also extends to arrangements in which the dielectric region underneath the guard ring 2 has multiple thicknesses but where there is either no threshold adjustment implant underneath the dielectric region, or the threshold adjustment implant is located not only underneath a portion of the dielectric region which is not located towards the anode connection. For example, the threshold adjustment material may be located uniformly underneath the dielectric region. Whilst not optimal, such an arrangement may still improve the Schottky diode behaviour to some extent.

Whilst the above embodiments have been described with reference to a guard ring 2, it is not absolutely essential that the polysilicon material is provided as a complete ring. Firstly, the precise geometry (square, rectangle etc.) of the silicon material is immaterial to some or even a large extent. Secondly, the polysilicon material need not fully surround the silicide material 8. Some benefit can be obtained even if the polysilicon material is provided as an incomplete ring (e.g. a ring with an interruption), or even only as one or more strips or similar in proximity with the silicide material 8.

In FIG. 2, a silicide layer is located on the guard ring 2. This serves to facilitate connection to the guard ring 2. This layer may but does not have to be in contact with the silicide material of anode 8. However, as used in the above description, the "edge of the silicide material" refers to the (lateral) edge of material 8, not the edge of the layer 8a of material on guard ring 2.

It will be appreciated that instead of a metal silicide the material 8 may be made from a metal or similar. Further, the guard ring may be made from any semi-conductive, conductive or metallic material, although polysilicon may provide certain advantages. The metal used for the guard ring may be any of (without limitation): aluminium, tungsten, titanium (in an alloy or as the nitride due to its chemical reactivity when pure), cobalt, nickel, hafnium, molybdenum, ruthenium, tantalum and platinum. Alternatively, conductive metal silicide used for the guard ring may be any of cobalt silicide and titanium silicide. It will also be appreciated that devices having reversed doping polarities (when compared with those mentioned above) are also possible. The electrical behaviour of these Schottky diodes is similar to n-type ones and the same techniques can be used in either case to improve their performance.

In test structures according to the above embodiments, thicknesses of 14 nm and 40 nm have been used for the thick dielectric region, and a thickness of 7 nm has been used for the thin dielectric region. Various other thicknesses are under consideration by the inventors, such as 7 nm or 12.5 nm for the thick dielectric region, and 4 nm for the thin dielectric region.

It will be appreciated that this invention has been explained as being suitable for integration into a typical dual dielectric region silicon CMOS process suitable for IC manufacture. However the invention is not restricted to that process—it is usable for many existing and future semiconductor processes whenever good quality Schottky diodes are required.

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:
1. A Schottky diode comprising:
   a semiconductor region;
   a first terminal comprising a metal or a metal silicide or being metallic;
   a second terminal comprising at least a portion of the semiconductor region;
   a material in close proximity to, or in contact with, or surrounding one of the first and second terminals, wherein said material is one of an at least partly conductive material and a material capable of holding a charge;
   a field insulator located at least partly in the semiconductor region; and
   a dielectric region located over the semiconductor region between the field insulator and said one of the first and second terminals for isolating said material from the semiconductor region;
   wherein the dielectric region comprises insulating regions of different thicknesses.
2. A Schottky diode according to claim 1, wherein the dielectric region comprises a thicker and a thinner insulating region, the thicker insulating region being closer to said one of the first and second terminals than the thinner insulating region.

3. A Schottky diode according to claim 2, wherein the thickness of the thinner insulating region is no more than 15 nm and the thickness of the thicker insulating region is no more than 150 nm.

4. A Schottky diode according to claim 2, wherein an ion implanted threshold adjusting material is located in the semiconductor region underneath the dielectric region.

5. A Schottky diode according to claim 4, wherein the threshold adjusting material is located underneath the thinner insulating region.

6. A Schottky diode according to claim 4, wherein the threshold adjusting material is located underneath the thinner insulating region which is sufficiently close to, but sufficiently spaced from, said first or second terminal so that reverse leakage and forward voltage drop are reduced and current drive is improved when compared with a substantially similar diode in which the threshold adjusting material is located underneath said first or second terminal or underneath an uniformly thick insulating region in contact with said first or second terminal.

7. A Schottky diode according to claim 4, wherein the threshold adjusting material is not located underneath the field insulator, the thicker insulating region and the first and second terminals.

8. A Schottky diode according to claim 4, wherein the threshold adjusting material comprises an opposite doping type to that of the semiconductor region.

9. A method of manufacturing a Schottky diode according to claim 4, wherein the threshold adjustment material is implanted in the semiconductor region either before or after growing the dielectric region.

10. A Schottky diode according to claim 2, wherein the thickness of the thicker insulating region is more than 20 nm and the thickness of the thinner insulating region is no more than 15 nm.

11. A Schottky diode according to claim 2, wherein the thickness of the thicker insulating region is at least X percent greater than the thickness of the thinner insulating region, wherein X is selected from the group consisting of 10, 20, 30, 40, 50 and 100.

12. A Schottky diode according to claim 2, wherein the thicknesses of the insulating regions are such that the capacitance per unit area of the insulating regions are the same.

13. A Schottky diode according to claim 2, wherein an implanted material is located in the semiconductor region underneath the dielectric region.

14. A Schottky diode according to claim 13, wherein the implanted material is located underneath the thinner insulating region.

15. A Schottky diode according to claim 13, wherein the implanted material is an ion implanted material.

16. A Schottky diode according to claim 13, wherein the implanted material is not located underneath the field insulator, the thicker insulating region and the first and second terminals.

17. A Schottky diode according to claim 13, wherein the implanted material comprises an opposite doping type to that of the semiconductor region.

18. A Schottky diode according to claim 1, wherein the dielectric region comprises a thinner and a thicker insulating region so that the parasitic capacitance of the diode is substantially reduced when compared with a substantially similar diode having a uniformly thick insulating region.

19. A Schottky diode according to claim 1, wherein said material substantially fully covers the dielectric region.

20. A Schottky diode according to claim 1, wherein said material covers at least a portion of the field insulator.

21. A Schottky diode according to claim 1, wherein said material does not cover the field insulator.

22. A Schottky diode according to claim 1, wherein said material at least partly surrounds said first or second terminal.

23. A Schottky diode according to claim 1, wherein said material forms a ring around said first or second terminal.

24. A Schottky diode according to claim 1, wherein an insulating spacer is provided between the edges of said first or second terminal and said material.

25. A Schottky diode according to claim 1, further comprising a first electrical connection to the first terminal and a second electrical connection to said material.

26. A Schottky diode according to claim 25, wherein the first and second electrical connections are connected together.

27. A Schottky diode according to claim 25, wherein the first and second electrical connections are not connected together so that different voltages can be applied to the first and second electrical connections.

28. A Schottky diode according to claim 1, wherein the first terminal is an anode and the second terminal is a cathode.

29. A Schottky diode according to claim 1, wherein said material comprises polysilicon.

30. A method of manufacturing a Schottky diode according to claim 1, wherein the diode is manufactured using CMOS and/or BICMOS processes.

31. A Schottky diode comprising:
a first terminal comprising a metal or a metal silicide or being metallic;
a second terminal comprising a semiconductor material;
a material in close proximity to, or in contact with, or surrounding one of the first and second terminals, wherein said material is one of an at least partly conductive material and a material capable of holding a charge;
a field insulator located in a well region located in or on a substrate made of the semiconductor material; and
a dielectric region located over the semiconductor region between the field insulator and one of the first and second terminals for isolating said material from the semiconductor region, the dielectric region having first and second portions;
wherein an ion implanted threshold adjusting material is located in the semiconductor region underneath the first portion of the dielectric region but not underneath the second portion, and wherein said second portion is located between said one of the first and second terminals and the first portion of the dielectric region.

32. A Schottky diode comprising:
a first terminal comprising a metal or a metal silicide or being metallic;
a second terminal comprising a semiconductor material;
a material in close proximity to, or in contact with, or surrounding one of the first and second terminals, wherein said material is one of an at least partly conductive material and a material capable of holding a charge;
a field insulator located in a well region located in or on a substrate made of the semiconductor material; and
a dielectric region located over the semiconductor region between the field insulator and one of the first and second terminals for isolating said material from the semiconductor region, the dielectric region having first and second portions;

wherein an implanted material is located in the semiconductor region underneath the first portion of the dielectric region but not underneath the second portion, and wherein said second portion is located between said one of the first and second terminals and the first portion of the dielectric region.

* * * * *